United States Patent [19]
Yokogi

[11] Patent Number: 5,468,937
[45] Date of Patent: Nov. 21, 1995

[54] IMPURITY REMOVING SYSTEM FOR THE DELIVERY OF HIGH PURITY GASES

[75] Inventor: Kazuo Yokogi, Tokyo, Japan

[73] Assignee: Teisan Kabushiki Kaisha, Tokyo, Japan

[21] Appl. No.: 222,924

[22] Filed: Apr. 5, 1994

[30] Foreign Application Priority Data

Apr. 7, 1993 [JP] Japan ..................................... 5-080802

[51] Int. Cl.⁶ ..................................................... H05B 6/10
[52] U.S. Cl. ........................... 219/634; 219/635; 219/644; 134/1
[58] Field of Search ..................................... 219/618, 634, 219/635, 629, 630, 643, 644; 134/1

[56] References Cited

U.S. PATENT DOCUMENTS

| | | | |
|---|---|---|---|
| 3,092,514 | 6/1963 | Tomberlin | 134/1 |
| 3,615,823 | 10/1971 | Tuma et al. | 134/24 |
| 3,644,696 | 7/1972 | Magner, Jr. et al. | 134/1 |
| 3,923,653 | 12/1975 | Lavins, Jr. | 134/1 |
| 4,511,407 | 4/1985 | Steininger | 134/1 |
| 4,576,698 | 3/1986 | Gallagher et al. | 134/1 |

Primary Examiner—Philip H. Leung
Attorney, Agent, or Firm—Burns, Doane, Swecker & Mathis

[57] ABSTRACT

A pipe impurity removing apparatus and process is provided, in which moisture adhered on the inner peripheral surface of a supply line can be surely removed, regardless of the pre- or post-completion of a piping execution, and the reduction of its working time can be aimed at. The inner peripheral surface of a pipe 30 which constitutes a supply line 3 for a semiconductor manufacturing unit, is coated or surface-modified with chromium oxide 6 which is a dielectric. A purge gas is caused to flow through the pipe 30 from the upperstream side to the downstream side, and an impurity remover 7 is engaged with the pipe 30 and high-frequency induction heating is applied thereto to heat the chromium oxide 6, whereby moisture adsorbed on the chromium oxide 6 is exhausted and removed together with the purge gas indicated by an arrowmark from the inside of the pipe 30 to the atmosphere.

17 Claims, 5 Drawing Sheets

IMPURITY REMOVING SYSTEM FOR THE DELIVERY OF HIGH PURITY GASES

BACKGROUND OF THE INVENTION

The present invention relates to an impurity removing apparatus for removing an impurity adhered on the inner peripheral surface of a pipe for transporting a gas for manufacture of semiconductors or the like.

DESCRIPTION OF THE PRIOR ART

In the manufacture of semiconductors, a gas for manufacture of semiconductors which is a special material gas is indispensable. This gas for manufacture of semiconductors is supplied from a cylinder 1 to a semiconductor manufacturing unit 4 through a supply line 3, as shown in FIG. 6. The cylinder 1 which constitutes a gas supply system for use in the manufacture of semiconductors, is designed and constructed with high performance, and it is filled with a gas for manufacture of semiconductors (indicated by an arrowmark in FIG. 6), for example silane gas ($SiH_4$ gas) or nitrogen gas, which possesses dangerous properties such as toxicity, combustibility, corrosiveness and suffocativeness. In the viewpoint of securing the safety, one cylinder or a plurality of cylinders including standbys are accommodated and installed in the inside of a cylinder cabinet 2.

The supply line 3 is constructed, in view of its execution, by connecting a plurality of pipes 30 in turn from either of the cylinder cabinet 2 or semiconductor manufacturing unit 4, and it performs the function of smoothly transporting the gas for manufacture of semiconductors from the cylinder 1 to the semiconductor manufacturing unit 4 isolated therefrom, as shown by an arrowmark in FIG. 6.

In addition, this supply line 3 is generally arranged in an undulating situation in-doors or out-of-doors, or in a complicated piping situation wherein it is bent lengthwise, breadthwise or slopewise in-doors, depending on the relation of the installation place or space.

By the way, various kinds of impurities are adhered on the inner peripheral surface of the supply line 3, regardless of the pre- or post-completion thereof. Among these impurities, one which especially comes into question is moisture which will be adsorbed (adhered) on the inner peripheral surface of the supply line 3 by means of its intermolecular adsorptive force.

If the gas for manufacture of semiconductors is transported from the cylinder 1 to the semiconductor manufacturing unit 4 isolated therefrom while moisture has been adsorbed on the inner peripheral surface of the supply line 3 as mentioned above, the adsorbed moisture breaks into the gas and as a result, the amount of moisture in the gas for manufacture of semiconductors must be increased, but slightly. Thus, if moisture, even in a fine amount, is contained in the gas for manufacture of semiconductors, a large obstacle will be caused in the quality of produced semiconductors.

In order to solve the aforementioned harmful influence, in the prior art, there have been adopted such methods that before the completion of the supply line 3, the pipes 30 are subjected to baking, thereby removing moisture, and after its completion, a long tape heater 5 is wound on the supply line 3 in turn from the upperstream side to the downstream side and an electric current is supplied to this tape heater 5, thereby removing moisture, as shown in FIG. 7.

In the prior art, as disclosed hereabove, moisture is removed by baking the supply line 3 before its completion. According to this baking method, however, the removal of moisture is impossible after the completion of the supply line 3.

In order to improve the aforementioned problem, another method has been sometimes adopted in which moisture is removed by winding a tape heater 5 on the supply line 3 in turn from the upperstream side to the downstream side, after the completion thereof, and supplying an electric current to this tape heater 5. Since the supply line 3 is arranged in a complicated piping situation depending on the relation of the installation place or space, however, it is difficult or impossible to carry out the winding operation of the tape heater 5 depending on where the installation place is. Thus, the supply of the gas for manufacture of semiconductors is often started up while moisture is not sufficiently removed therefrom.

Furthermore, it takes at least about one week for completing the winding operation of the tape heater 5 on the supply line 3 because this winding operation is troublesome work and its delay cannot be solved.

SUMMARY OF THE INVENTION

It is an object of the present invention to provide a pipe impurity removing apparatus, by which moisture adhered on the inner peripheral surface of a supply line can be surely removed regardless of the pre- or post-completion of its piping execution and the reduction of its working period can be aimed at.

In order to achieve the aforementioned purpose in a first aspect of the present invention, a dielectric is provided on the inner peripheral surface of a pipe for transporting a fluid to surface-treat the same pipe, and an impurity remover is engaged with the pipe and high-frequency heating is applied to the impurity remover to heat the dielectric, whereby an impurity adhered on the inner peripheral surface of the pipe is removed.

Moreover, in order to achieve the aforementioned purpose in the first aspect of the present invention, when the dielectric is heated, a gas for exhaust use is caused to flow through the inside of the pipe, whereby the impurity removed from the inner peripheral surface of the pipe is exhausted to the atmosphere.

In order to achieve the aforementioned purpose in a second aspect of the present invention, an impurity remover is engaged with the outer pipe of a double pipe for transporting a fluid through its inner pipe, and high-frequency heating that is chosen on the basis of the property of the inner pipe is applied to the impurity remover to heat the inner pipe, whereby an impurity adhered on the inner peripheral surface of the double pipe is removed.

Moreover, in order to achieve the aforementioned purpose in the second aspect of the present invention, when the inner pipe is heated, a gas for exhaust use is caused to flow through the inside of the inner pipe, whereby the impurity removed from the inner peripheral surface of the inner pipe is exhausted to the atmosphere.

According to the first aspect of the present invention having the aforementioned construction, when the impurity remover is properly engaged with the outer periphery of the pipe and an electric current is supplied to the impurity remover, electrical energy is converted to thermal energy in the inside of the dielectric to generate heat, whereby the impurity adhered on the dielectric is removed.

Furthermore, owing to the fact that a gas for exhaust use is caused to flow through the pipe, thereby exhausting the impurity adhered on the dielectric from the inside of the pipe to the atmosphere, it is enabled to remove the impurity securely.

According to the second aspect of the present invention having the aforementioned construction, when the impurity remover is properly engaged with the outer periphery of the outer pipe of the double pipe and an electric current is supplied to the impurity remover, electrical energy is converted to thermal energy in the inside of the inner pipe to generate heat, whereby the impurity adhered on the inner pipe is removed.

Furthermore, owing to the fact that a gas for exhaust use is caused to flow through the inner pipe, thereby exhausting the impurity adhered on the inner pipe from the inside of the inner pipe to the atmosphere, it is enabled to remove the impurity surely.

DETAILED DESCRIPTION OF THE INVENTION

Figure 1:
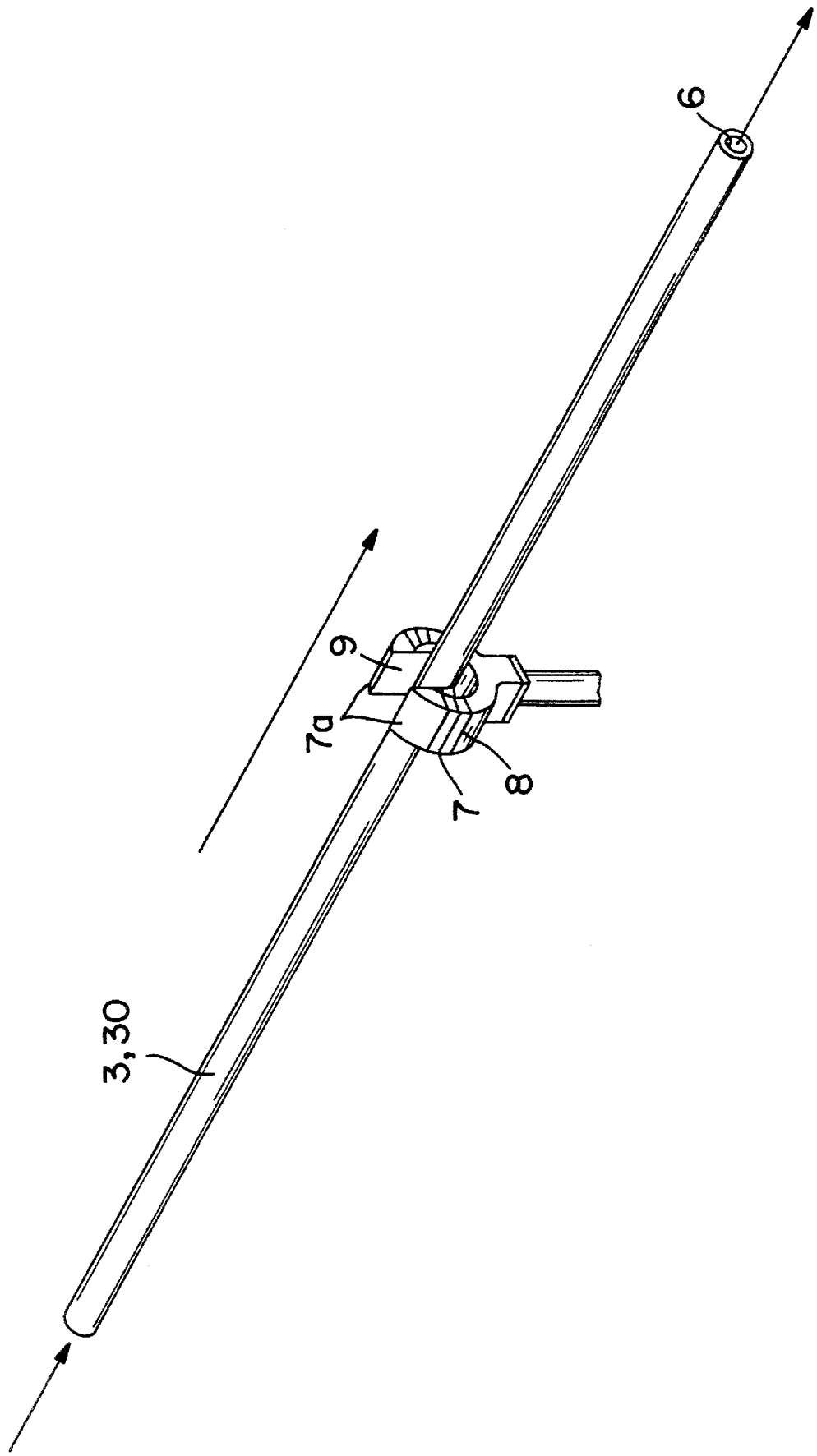
FIG. 1 is a perspective view showing the situation of the pipe impurity removing apparatus according to the first aspect of the present invention, which is being used before a supply line is completed.

The first aspect of the present invention will be described in detail, referring to one embodiment illustrated in FIG. 1 to FIG. 4.

On all of FIG. 1 to 7 of the present specification, the reference numerals have the following meaning:

3—supply line, 30—pipe, 31—double pipe, 31a— inner pipe, 31b—outer pipe, 6—chromium oxide, 7— impurity remover, 8—heating coil.

The pipe impurity removing apparatus according to the first aspect of the present invention is constructed as shown in FIG. 1, wherein the inner peripheral surface of a pipe 30 which constitutes a supply line 3 is coated with or surface-modified with chromium oxide 6, an impurity remover 7 is engaged with the pipe 30 and high-frequency induction heating is applied to the impurity remover 7 to heat the chromium oxide 6, whereby moisture adsorbed on the chromium oxide 6 is removed.

The said chromium oxide (dielectric) 6 is, as well known, of a substance which itself does not permit an electric current to pass therein, but causes electric polarization when placed in an electric field, and also of an insulator. When the whole of the inner peripheral surface of the supply line 3, or in other words, of the pipe 30 is coated or surface-modified with the chromium oxide 6, it performs the functions of protecting the same pipe 30 and causing high-frequency induction heating.

Figure 2:
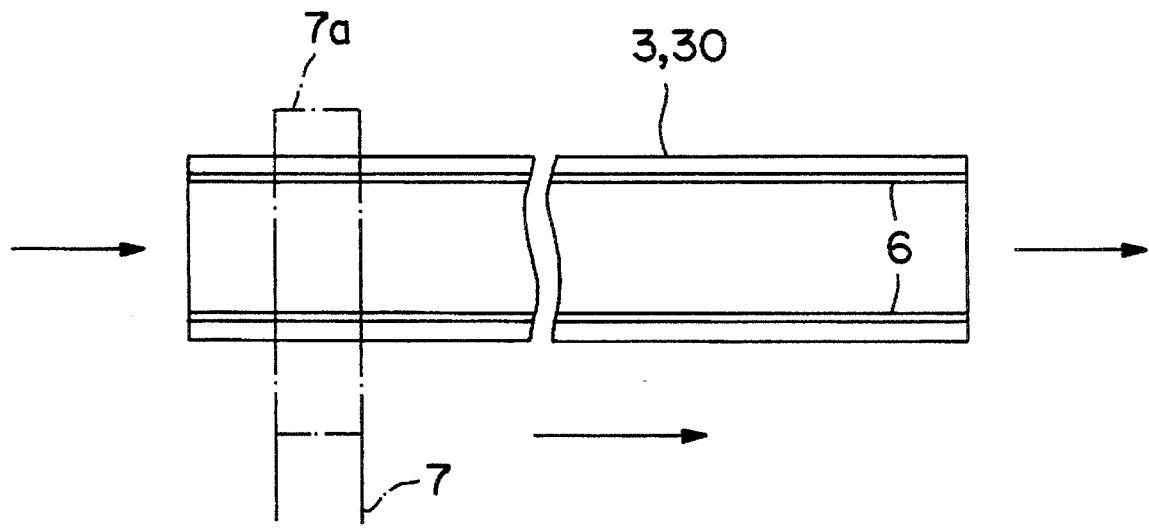
FIG. 2 is an illustrative view showing the situation of the pipe impurity removing apparatus according to the first aspect of the present invention during use.
Figure 3:
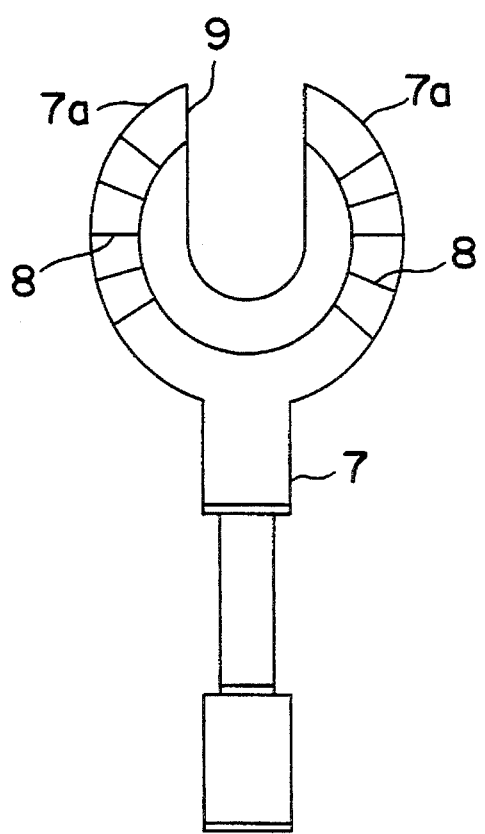
FIG. 3 is an illustrative view showing the impurity remover of the pipe impurity removing apparatus according to the first aspect of the present invention.

The impurity remover 7 is constructed in a small size structure shaped almost in the form of a letter Y, which is made portable and economized in space, and has a pair of branch portions 7a branched curvedly right and left, as shown in FIG. 2 and FIG. 3, wherein a heating coil 8 is wound on each of the pair of said branch portions 7a, and a positioning member 9 shaped almost in the form of a letter U, which is made of an insulator such as ceramics, is mounted between the ends of the pair of said branch portions 7a so that the outer periphery of the pipe 30 is positioned by being surrounded by means of this positioning member 9.

Moreover, this impurity remover 7 has a cooling device (not shown) built therein which prevents the impurity remover 7 from being heated by a cooling liquid, so that an operator does not get burnt when gripping the impurity remover 7.

Although the impurity remover 7 which has been described in this embodiment is of such a type that an operator grips, this impurity remover 7 may be clamped by a working robot or the like. The other parts are the same as in the prior art example.

A method, according to the invention, for removing moisture (impurity) adsorbed (adhered) on the surface of the chromium oxide 6 will be next described.

At first, the removal of moisture will be satisfactorily carried out, before the completion of the supply line 3, by causing a purge gas (gas for exhaust use) indicated by an arrowmark to flow through the pipe 30, as shown in FIG. 1 or FIG. 2, engaging the positioning member 9 of the impurity remover 7 with the outer periphery of the pipe 30 while the pipe 30 is inserted therein, and then supplying an electric current to the heating coil 8.

As to the frequency of the high-frequency wave used here, the most suitable one will be determined and chosen after consideration of the property of the chromium oxide 6, the quantity and length of the chromium oxide 6, and the heating efficiency, economy, easiness of maintenance and other factors.

In this way, when the supply of electricity is carried out, electrical energy is converted to thermal energy in the inside of the chromium oxide 6 to generate heat, whereby moisture adsorbed on the chromium oxide 6 is exhausted together with the purge gas from the pipe 30 to the atmosphere. Then, the aforementioned operation will be satisfactorily repeated by moving gradually the impurity remover 7 along the pipe 30 in the longitudinal direction (the direction of an arrowmark in FIG. 1) thereof.

Figure 4:
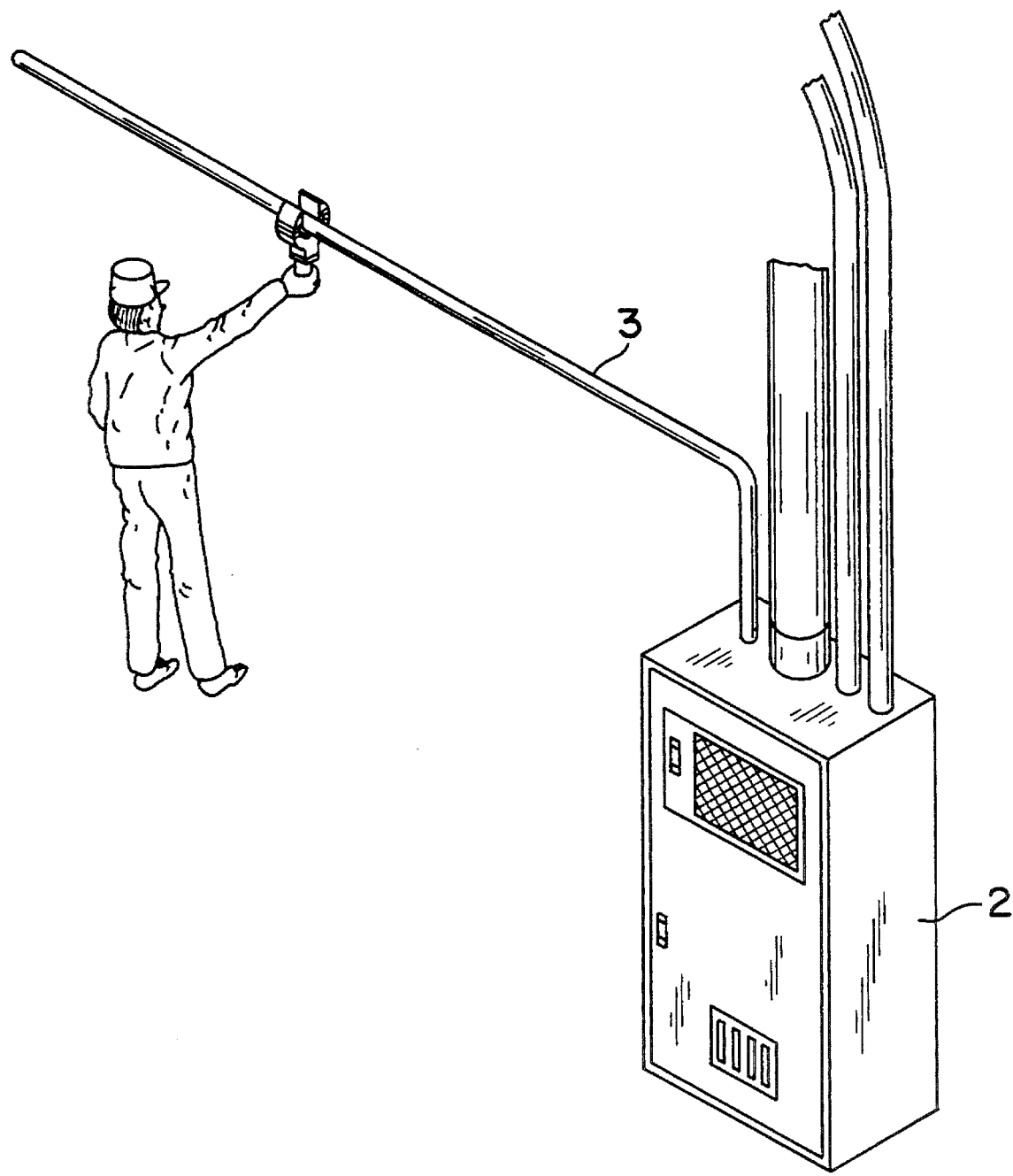
FIG. 4 is a perspective view showing the situation of the pipe impurity removing apparatus according to the first aspect of the present invention, which is being used after the supply line is completed.

In the next place, the removal of moisture will be satisfactorily carried out, also after the completion of the supply line 3, by causing the purge gas indicated by an arrowmark to flow through the supply line 3 from the upperstream side to the downstream side, as shown in FIG. 4, engaging properly the positioning member 9 of the impurity remover 7 with the outer periphery of the supply line 3 on the upperstream side while the supply line 3 is inserted therein, and then supplying an electric current to the heating coil 8.

Also as to the frequency of the high-frequency wave used here, the most suitable one will be determined and chosen after consideration of the property of the chromium oxide 6, the quantity and length of the chromium oxide 6, and the heating efficiency, economy, easiness of maintenance and other factors.

Thus, when the supply of electricity is carried out, electrical energy is converted to thermal energy in the inside of the chromium oxide 6 to generate heat, whereby moisture adsorbed on the chromium oxide 6 is exhausted together with the purge gas from the supply line 3 to the atmosphere.

Then, the aforementioned operation will be satisfactorily repeated by moving gradually the impurity remover 7 along the supply line 3 (in the direction of an arrowmark in FIG. 4) from the upperstream side to the downstream side, whereby moisture can be completely discharged and removed from the whole of the inner peripheral surface of the supply line 3.

Owing to the aforementioned construction, wherein high-frequency induction heating is utilized to remove moisture, it is possible to apply effectively the following features of high-frequency induction heating, for example, (1) capable of effecting heating answering the purpose such as uniform heating, local heating or selective heating, (2) capable of optionally selecting the heating atmosphere, (3) easy in control because of rapid responsibility, (4) capable of making clean the working environment, (5) high in heating efficiency because the heating material generates heat directly, (6) capable of effecting heating in non-contact with the heating material, (7) capable of effecting rapid heating or high-temperature heating because large energy density is applied to the heating material, (8) accurate, rapid and easy in temperature control.

According to the present invention, it is therefore enabled to utilize high-frequency induction heating to remove moisture effectively, in place of the baking method or taping method in the prior art.

Moreover, owing to the fact that the small size impurity remover 7 is properly engaged with the supply line 3, regardless of the piping place or piping situation of the supply line 3, it is possible to expect the complete removal of moisture regardless of where the place is, and it is possible, depending on this complete removal of moisture, to aim at improving the transportation of a gas (fluid) for manufacture of semiconductors or the quality of produced semiconductors. Since the troublesome work of winding the tape heater 5 can be omitted, it is possible to expect the speedup of operation and it is, therefore, enabled to complete the moisture removing operation only one day.

Owing to the fact that a purge gas is caused to flow through the supply line 3 or pipe 30 and moisture adsorbed on the chromium oxide 6 is discharged together with the purge gas from the supply line 3 or pipe 30 to the atmosphere, it is enabled to remove moisture adsorbed thereon surely.

Furthermore, since the moisture removing operation can be carried out at the same time when the supply line 3 is assembled according to the present invention, although the moisture removing operation cannot be carried out simultaneously with the assembly of the supply line 3 in the prior art, it is possible to contribute to reduce the working time.

In addition, although the chromium oxide 6, with which the inner peripheral surface of the supply line 3 is coated or surface modified, has been described in the aforementioned embodiment, there is no limit to this chromium oxide 6. Another substance may be used as the coating or surface-modifying material, so long as it is a dielectric.

Figure 5:
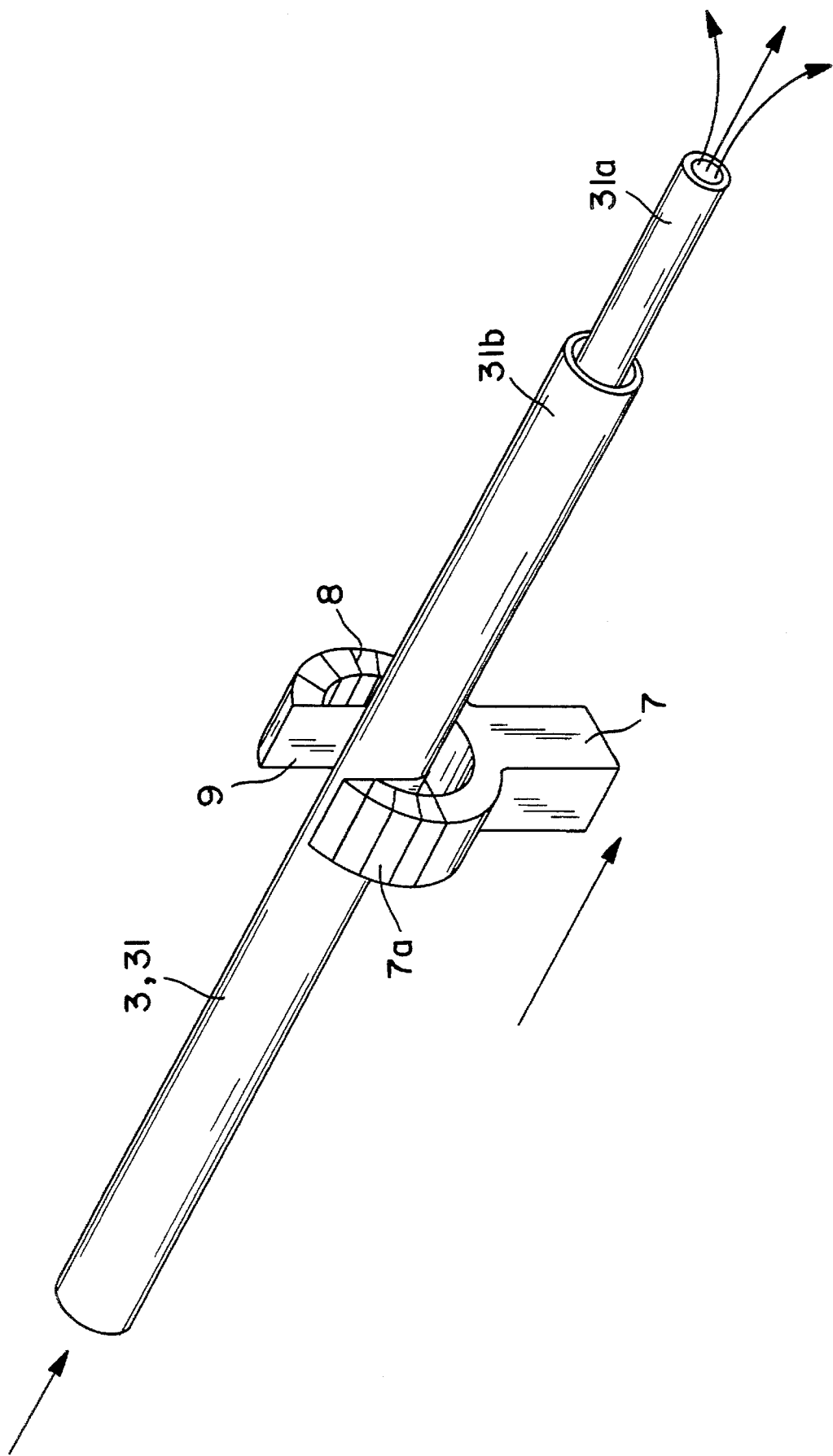
FIG. 5 is a perspective view showing the situation of the pipe impurity removing apparatus according to the second aspect of the present invention, which is being used before a supply line is completed.
Figure 6:
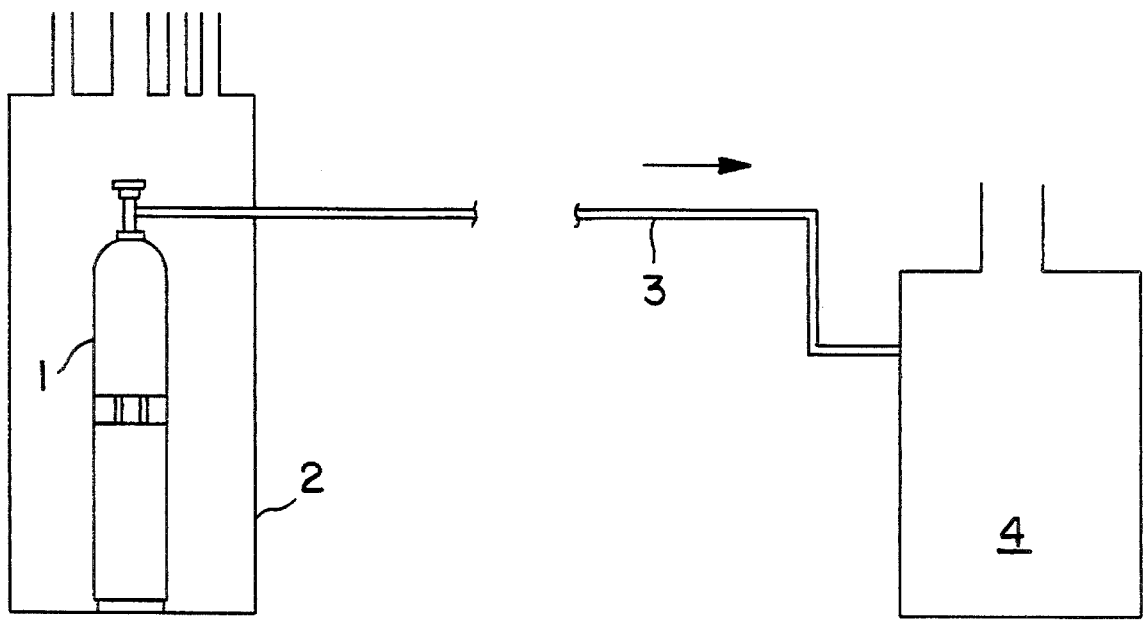
FIG. 6 is an illustrative view showing the supply system of a gas for manufacture of semiconductors.
Figure 7:
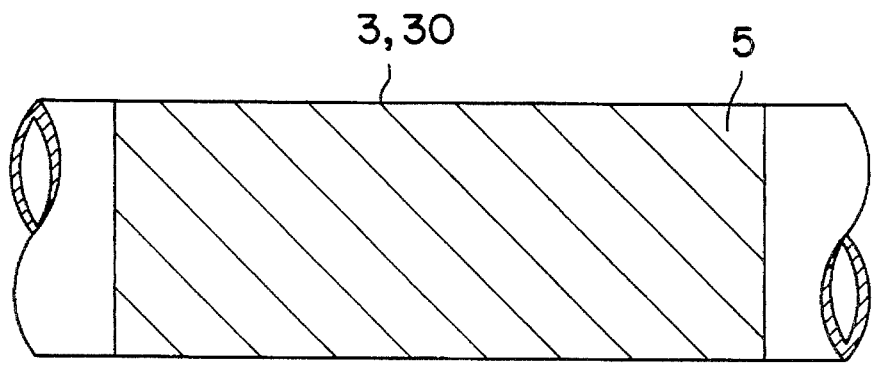
FIG. 7 is an illustrative view showing the pipe impurity removing method in the prior art.

In the next place, FIG. 5 shows the second aspect of the present invention. In this case, an impurity remover 7 is engaged with the outer pipe 31b of a double pipe 31 for transporting a gas for manufacture of semiconductors through its inner pipe 31a and high-frequency heating chosen on the basis of the property of the inner pipe 31a is applied to this impurity remover 7 to heat the inner pipe 31a, whereby moisture adhered on the inner peripheral surface of the inner pipe 31a is removed.

In the double pipe 31 which is often used at the present time, for taking a countermeasure to the danger of gas leakage caused in the manufacture of semiconductors, its inner pipe 31a with a small diameter for supplying the gas for manufacture of semiconductors is made up of stainless steel, and its outer pipe 31b with a large diameter is made up of stainless steel or plastics, wherein nitrogen gas (not shown) or the like is filled between these inner pipe 31a and outer pipe 31b.

The supply line 3 is constructed by connecting a plurality of the double pipes 31 in turn from either of a cylinder cabinet 2 or semiconductor manufacturing unit 4. The other parts are the same as in the first aspect of the present invention.

A method for removing moisture adsorbed on the surface of the inner pipe 31a will be next described.

At first, the removal of moisture will be satisfactorily carried out, before the completion of the supply line 3, by causing a purge gas (gas for exhaust use) indicated by an arrowmark to flow through the inner pipe 31a, as shown in FIG. 5, engaging the positioning member 9 of the impurity remover 7 with the outer periphery of the outer pipe 31b while the outer pipe 31b is inserted therein, and then supplying an electric current to the heating coil 8.

As to the frequency of the high-frequency wave used here, the most suitable one will be determined and chosen after consideration of the property of the inner pipe 31a, the quantity and length of the inner pipe 31a, and the heating efficiency, economy, easiness of maintenance and other factors.

In this way, when the supply of electricity is carried out, electrical energy is converted to thermal energy in the inside of the inner pipe 31a to generate heat, whereby moisture adsorbed on the inner pipe 31a is exhausted and removed together with the purge gas from the inner pipe 31a to the atmosphere. Then, the aforementioned operation will be satisfactorily repeated by moving gradually the impurity remover 7 along the double pipe 31 in the longitudinal direction (the direction of an arrowmark in FIG. 5) thereof.

In the next place, the removal of moisture will be satisfactorily carried out, also after the completion of the supply line 3, by causing the purge gas to flow through the inner pipe 31a of the supply line 3 from the upperstream side to the downstream side, engaging properly the positioning member 9 of the impurity remover 7 with the outer periphery of the supply line 3 on the upperstream side while the supply line 3 is inserted therein, and then supplying an electric current to the heating coil 8.

Also as to the frequency of the high-frequency wave used here, the most suitable one will be determined and chosen after consideration of the property of the inner pipe 31a, the quantity and length of the inner pipe 31a, and the heating efficiency, economy, easiness of maintenance and other factors.

Thus, when the supply of electricity is carried out, electrical energy is converted to thermal energy in the inside of the inner pipe 31a to generate heat, whereby moisture adsorbed on the inner pipe 31a is exhausted together with the purge gas from the supply line to the atmosphere.

Then, the aforementioned operation will be satisfactorily repeated by moving gradually the impurity remover 7 along the supply line 3 from the upperstream side to the downstream side, whereby moisture can be completely exhausted and removed from the whole of the inner peripheral surface of the inner pipe 31a of the supply line 3 (see FIG. 4).

Also in this embodiment, there can be expected the same operational effects as in the aforementioned embodiment according to the first aspect of the present invention. Moreover, since the frequency of the high-frequency wave is determined and chosen due to consideration of the property of the inner pipe 31a, the quantity and length of the inner pipe 31a, the heating efficiency, economy and easiness of maintenance and other factors, it is obvious that the necessity of coating or surface-modifying the inner pipe 31a with a dielectric consisting of the chromium oxide 6 can be omitted and the manufacturing cost can be reduced.

In addition, although an example of using the impurity remover 7 constructed in a small size structure shaped almost in the form of a letter Y has been described in the aforementioned embodiments, there is not limited to this impurity remover 7 at all. Another structure or shape of impurity remover may be used, as long as it is one performing the same function.

Although an example of the purge gas caused to flow through the pipe 30 or inner pipe 31a has been described in the aforementioned embodiments, the purge gas may not be caused to flow, if moisture can be removed from the inner peripheral surface of the pipe 30 or inner pipe 31a.

In the aforementioned embodiment, the supply line 3 for transporting the gas for manufacture of semiconductors has been described as an object, to which the pipe impurity removing apparatus is applied. However, there is not limited to this supply line 3 at all, and another pipe may be used as the object, as long as it is one, on which an impurity such as moisture is adsorbed.

Furthermore, in the aforementioned embodiments, an example of utilizing the high-frequency induction heating has been described. If microwave heating or dielectric heating is properly utilized, the same operational effects as in the aforementioned embodiment can be obtained.

I claim:

1. An impurity removing system for the delivery of high purity gases comprising;
   (a) a length of pipe for conveying a supply of high purity gases having an outer surface and an inner surface;
   (b) a dielectric layer coated on the inner surface of the length of pipe, and;
   (c) an impurity removing high frequency induction heater for supplying electrical energy to the dielectric layer which is converted to thermal energy in the dielectric layer coated on the inner surface of the length of pipe.

2. The impurity removing system of claim 1, wherein the dielectric layer is chromium oxide.

3. The impurity removing system of claim 1, wherein the impurity removing high frequency induction heater comprises a heating coil.

4. The impurity removing system of claim 1, the impurity removing high frequency induction heater further comprising a positioning member for receiving a portion of the outer surface of the length of pipe.

5. The impurity removing system of claim 1, the impurity removing high frequency induction heater further comprising a cooling system.

6. The impurity removing system of claim 1, wherein the length of pipe is in fluid communication with a semiconductor manufacturing unit.

7. A process for the removal of impurities in a system for the delivery of high purity gases, comprising high frequency induction heating a first length of pipe for conveying a supply of high purity gases having an outer surface and an inner surface, a dielectric layer coated on the inner surface thereof, wherein electrical energy supplied to the dielectric layer is converted to thermal energy in the dielectric layer coated on the inner surface of the length of pipe.

8. The process of claim 7, further comprising passing a purge gas through the length of pipe during the high frequency induction heating thereof.

9. The process of claim 7, further comprising heating a second length of pipe downstream of the first length.

10. The process of claim 7, further comprising delivering the high purity gas to a semiconductor manufacturing unit.

11. An impurity removal system for the delivery of high purity gases, comprising:
    (a) an inner length of pipe;
    (b) at least one outer pipe housing the inner length of pipe therein;
    (c) an impurity removing high frequency induction heater attachable to the outer pipe for supplying electrical energy to the inner pipe which is converted to thermal energy in the inner length of pipe.

12. The impurity removal system of claim 11, further comprising an inert gas layer between the inner and the outer lengths of pipe.

13. The impurity removal system of claim 11, wherein the inner length of pipe is stainless steel.

14. The impurity removal system of claim 11, wherein the outer length of pipe is stainless steel or plastic.

15. The impurity removal system of claim 11, wherein the inert gas layer is nitrogen.

16. The impurity removal system of claim 11, wherein said inner length of pipe is in fluid communication with a semiconductor manufacturing unit.

17. An impurity removing high frequency induction heater comprising; a positioning member receiving a portion of a length of pipe, the pipe having an inner surface and an outer surface, the inner surface having a layer of dielectric coated thereon and an induction heating coil positioned about the outer surface of the pipe.

* * * * *